US007546435B2

(12) United States Patent
LaBerge

(10) Patent No.: US 7,546,435 B2
(45) Date of Patent: *Jun. 9, 2009

(54) DYNAMIC COMMAND AND/OR ADDRESS MIRRORING SYSTEM AND METHOD FOR MEMORY MODULES

(75) Inventor: Paul A. LaBerge, Shoreview, MN (US)

(73) Assignee: Micron Technology. Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/706,032

(22) Filed: Feb. 13, 2007

(65) Prior Publication Data
US 2007/0143553 A1 Jun. 21, 2007

Related U.S. Application Data

(63) Continuation of application No. 10/773,518, filed on Feb. 5, 2004, now Pat. No. 7,181,584.

(51) Int. Cl.
*G06F 12/44* (2006.01)
*G06F 12/21* (2006.01)
(52) U.S. Cl. ...................... 711/167; 711/154
(58) Field of Classification Search ............... None
See application file for complete search history.

(56) References Cited

U.S. PATENT DOCUMENTS

| | | | |
|---|---|---|---|
| 3,777,154 A | 12/1973 | Lindsey | 250/227 |
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,443,845 A | 4/1984 | Hamilton et al. | 364/200 |

(Continued)

FOREIGN PATENT DOCUMENTS

EP 0849685 A2 6/1998

(Continued)

OTHER PUBLICATIONS

Gillingham, Peter, "SLDRAM Architectural and Functional Overview", 1997 SLDRAM Consortium, Aug. 29, 1997, pp. 1-14.

(Continued)

*Primary Examiner*—Hyung S Sough
*Assistant Examiner*—Duc T Doan
(74) *Attorney, Agent, or Firm*—Dorsey & Whitney LLP

(57) ABSTRACT

A memory module includes a memory hub that couples signals to memory devices mounted on opposite first and second surfaces of a memory module substrate. The memory devices are mounted in mirrored configuration with mirrored terminals of memory devices on opposite surfaces being interconnected. A memory hub mounted on each module alters the configuration of address and/or command signals coupled to the memory devices depending upon whether the memory devices on the first surface of the substrate or the memory devices on the second surface of the substrate are being accessed. Alternatively, the configuration of the address and/or command signals coupled to mirrored memory devices may be altered by a register mounted on the substrate that is coupled to the memory devices or by a memory controller coupled directly to memory devices on one or more memory modules.

9 Claims, 7 Drawing Sheets

U.S. PATENT DOCUMENTS

| | | | |
|---|---|---|---|
| 4,707,823 A | 11/1987 | Holdren et al. | 370/1 |
| 4,724,520 A | 2/1988 | Athanas et al. | 364/200 |
| 4,809,232 A | 2/1989 | Baumbaugh et al. | 365/221 |
| 4,823,403 A | 4/1989 | Twietmeyer | 455/607 |
| 4,825,208 A | 4/1989 | Mueller et al. | 340/825.02 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A | 4/1994 | Ahuja | 375/107 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,414,819 A | 5/1995 | Redmond et al. | 395/325 |
| 5,423,009 A | 6/1995 | Zhu | 395/325 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,493,437 A | 2/1996 | Lebby et al. | 359/152 |
| 5,497,476 A | 3/1996 | Oldfield et al. | 395/439 |
| 5,502,621 A | 3/1996 | Schumacher et al. | 361/760 |
| 5,532,856 A | 7/1996 | Li et al. | 359/118 |
| 5,544,319 A | 8/1996 | Acton et al. | 395/200.07 |
| 5,544,345 A | 8/1996 | Carpenter et al. | 395/477 |
| 5,566,325 A | 10/1996 | Bruce, II et al. | 395/494 |
| 5,568,574 A | 10/1996 | Tanguay, Jr. et al. | 385/14 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,623,534 A | 4/1997 | Desai et al. | 379/59 |
| 5,638,334 A | 6/1997 | Farmwald et al. | 365/230.03 |
| 5,659,798 A | 8/1997 | Blumrich et al. | 395/846 |
| 5,706,224 A | 1/1998 | Srinivasan et al. | 365/49 |
| 5,715,456 A | 2/1998 | Bennett et al. | 395/652 |
| 5,729,709 A | 3/1998 | Harness | 395/405 |
| 5,787,475 A | 7/1998 | Pawlowski | 711/137 |
| 5,808,897 A * | 9/1998 | Miller et al. | 716/1 |
| 5,818,844 A | 10/1998 | Singh et al. | 370/463 |
| 5,818,984 A | 10/1998 | Ahmad et al. | 385/14 |
| 5,819,304 A | 10/1998 | Nilsen et al. | 711/5 |
| 5,822,255 A | 10/1998 | Uchida | 365/194 |
| 5,831,467 A | 11/1998 | Leung et al. | 327/319 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,088,774 A | 7/2000 | Gillingham | 711/167 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,105,088 A | 8/2000 | Pascale et al. | 710/100 |
| 6,111,757 A | 8/2000 | Dell et al. | 361/737 |
| 6,125,431 A | 9/2000 | Kobayashi | 711/154 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,327 A | 11/2000 | Distinti et al. | 341/126 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,226,729 B1 | 5/2001 | Stevens et al. | 711/171 |
| 6,229,712 B1 | 5/2001 | Munoz-Bustamante et al. | 361/783 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,253 B1 | 7/2001 | Oberlaender et al. | 365/230.02 |
| 6,256,692 B1 | 7/2001 | Yoda et al. | 710/104 |
| 6,266,730 B1 | 7/2001 | Perino et al. | 710/126 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,343,171 B1 | 1/2002 | Yoshimura et al. | 385/50 |
| 6,344,664 B1 | 2/2002 | Trezza et al. | 257/82 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,366,375 B1 | 4/2002 | Sakai et al. | 359/115 |
| 6,366,529 B1 | 4/2002 | Williams et al. | 365/239 |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,273 B1 | 6/2002 | Fleck et al. | 710/131 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,654 B1 | 8/2002 | Story et al. | 710/307 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,377 B1 | 9/2002 | Farnworth et al. | 710/300 |
| 6,453,393 B1 | 9/2002 | Holman et al. | 711/154 |
| 6,457,116 B1 | 9/2002 | Mirsky et al. | 712/16 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |

| Patent No. | Date | Inventor | Class |
|---|---|---|---|
| 6,493,784 B1 | 12/2002 | Kamimura et al. | 710/309 |
| 6,496,909 B1 | 12/2002 | Schimmel | 711/163 |
| 6,501,471 B1 | 12/2002 | Venkataraman et al. | 345/424 |
| 6,502,161 B1 * | 12/2002 | Perego et al. | 711/5 |
| 6,505,287 B2 | 1/2003 | Uematsu | 711/170 |
| 6,507,899 B1 | 1/2003 | Oberlaender et al | 711/169 |
| 6,523,092 B1 | 2/2003 | Fanning | 711/134 |
| 6,523,093 B1 | 2/2003 | Bogin et al. | 711/137 |
| 6,526,498 B1 | 2/2003 | Mirsky et al. | 712/11 |
| 6,539,490 B1 | 3/2003 | Forbes et al. | 713/401 |
| 6,552,304 B1 | 4/2003 | Hirose et al. | 219/216 |
| 6,552,564 B1 | 4/2003 | Forbes et al. | 326/30 |
| 6,553,479 B2 | 4/2003 | Mirsky et al. | 712/16 |
| 6,567,963 B1 | 5/2003 | Trezza | 716/8 |
| 6,570,429 B1 | 5/2003 | Hellriegel | 327/295 |
| 6,584,543 B2 | 6/2003 | Williams et al. | 711/105 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,599,031 B2 | 7/2003 | Li | 385/88 |
| 6,615,325 B2 | 9/2003 | Mailloux et al. | 711/154 |
| 6,622,227 B2 | 9/2003 | Zumkehr et al. | 711/167 |
| 6,623,177 B1 | 9/2003 | Chilton | 385/88 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,957 B2 | 10/2003 | Stevens et al. | 711/171 |
| 6,643,787 B1 | 11/2003 | Zerbe et al. | 713/400 |
| 6,646,929 B1 | 11/2003 | Moss et al. | 365/194 |
| 6,651,139 B1 | 11/2003 | Ozeki et al. | 711/118 |
| 6,658,509 B1 | 12/2003 | Bonella et al. | 710/100 |
| 6,661,940 B2 | 12/2003 | Kim | 385/15 |
| 6,661,943 B2 | 12/2003 | Li | 385/18 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,681,301 B1 * | 1/2004 | Mehta et al. | 711/154 |
| 6,697,926 B2 | 2/2004 | Johnson et al. | 711/167 |
| 6,707,726 B2 | 3/2004 | Nishio et al. | 365/189.12 |
| 6,711,652 B2 | 3/2004 | Arimilli et al. | 711/141 |
| 6,715,018 B2 | 3/2004 | Farnworth et al. | 710/300 |
| 6,718,440 B2 | 4/2004 | Maiyuran et al. | 711/137 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,113 B2 | 6/2004 | Bhakta et al. | 365/63 |
| 6,751,703 B2 | 6/2004 | Chilton | 711/113 |
| 6,751,722 B2 | 6/2004 | Mirsky et al. | 712/15 |
| 6,752,539 B2 | 6/2004 | Colgan et al. | 385/92 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,261 B1 | 8/2004 | D'Antonio et al. | 710/301 |
| 6,775,747 B2 | 8/2004 | Venkatraman | 711/137 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,793,408 B2 | 9/2004 | Levy et al. | 385/88 |
| 6,793,411 B2 | 9/2004 | Seifert | 385/92 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,931 B2 | 11/2004 | Shih | 710/62 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,829,398 B2 | 12/2004 | Ouchi | 385/14 |
| 6,845,409 B1 | 1/2005 | Talagala et al. | 710/20 |
| 6,910,812 B2 | 6/2005 | Pommer et al. | 385/92 |
| 6,949,406 B2 | 9/2005 | Bosnyak et al. | 438/106 |
| 6,961,834 B2 | 11/2005 | Weber | 711/169 |
| 6,980,748 B2 | 12/2005 | Leas | 398/202 |
| 7,016,213 B2 | 3/2006 | Reeves et al. | 365/63 |
| 7,024,547 B2 | 4/2006 | Kartoz | 713/1 |
| 7,035,212 B1 | 4/2006 | Mittal et al. | 370/230 |
| 7,047,351 B2 | 5/2006 | Jeddeloh | 711/5 |
| 7,062,595 B2 | 6/2006 | Lindsay et al. | 710/315 |
| 7,102,907 B2 | 9/2006 | Lee et al. | 365/63 |
| 7,106,611 B2 | 9/2006 | Lee et al. | 365/200 |
| 7,106,973 B2 | 9/2006 | Kube et al. | 398/164 |
| 7,120,727 B2 | 10/2006 | Lee et al. | 711/5 |
| 7,120,743 B2 | 10/2006 | Meyer et al. | 711/118 |
| 7,136,953 B1 | 11/2006 | Bisson et al. | 710/307 |
| 7,171,508 B2 | 1/2007 | Choi | 710/307 |
| 7,174,409 B2 | 2/2007 | Jeddeloh | 710/311 |
| 2001/0034839 A1 | 10/2001 | Karjoth et al. | 713/190 |
| 2001/0039612 A1 | 11/2001 | Lee | 713/2 |
| 2002/0038412 A1 | 3/2002 | Nizar et al. | 711/170 |
| 2002/0112119 A1 | 8/2002 | Halbert et al. | 711/115 |
| 2002/0116588 A1 | 8/2002 | Beckert et al. | 711/161 |
| 2002/0144064 A1 | 10/2002 | Fanning | 711/144 |
| 2003/0005223 A1 | 1/2003 | Coulson et al. | 711/118 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0229734 A1 | 12/2003 | Chang et al. | 710/36 |
| 2003/0229770 A1 | 12/2003 | Jeddeloh | 711/213 |
| 2004/0022094 A1 | 2/2004 | Radhakrishnan et al. | 365/200 |
| 2004/0024959 A1 | 2/2004 | Taylor | 711/105 |
| 2004/0028412 A1 | 2/2004 | Murphy | 398/135 |
| 2004/0044833 A1 | 3/2004 | Ryan | 711/5 |
| 2004/0123088 A1 | 6/2004 | Poisner et al. | 713/1 |
| 2004/0126115 A1 | 7/2004 | Levy et al. | 398/116 |
| 2004/0128421 A1 | 7/2004 | Forbes | 710/303 |
| 2004/0144994 A1 | 7/2004 | Lee et al. | 257/200 |
| 2004/0148482 A1 | 7/2004 | Grundy et al. | 711/167 |
| 2004/0230718 A1 | 11/2004 | Polzin et al. | 710/22 |
| 2004/0236885 A1 | 11/2004 | Fredriksson et al. | 710/100 |
| 2004/0251929 A1 | 12/2004 | Pax et al. | 326/30 |
| 2004/0268009 A1 | 12/2004 | Shin et al. | 710/310 |
| 2005/0030797 A1 | 2/2005 | Pax et al. | 365/189.12 |
| 2005/0044304 A1 | 2/2005 | James | 711/105 |
| 2005/0071542 A1 | 3/2005 | Weber et al. | 711/105 |
| 2005/0091464 A1 | 4/2005 | James | 711/167 |
| 2005/0105350 A1 * | 5/2005 | Zimmerman | 365/201 |
| 2005/0146946 A1 | 7/2005 | Taylor | 365/189.05 |
| 2005/0162882 A1 | 7/2005 | Reeves et al. | 365/63 |
| 2005/0210185 A1 | 9/2005 | Renick | 711/105 |
| 2005/0210216 A1 | 9/2005 | Jobs et al. | 711/170 |
| 2005/0216648 A1 | 9/2005 | Jeddeloh | 710/311 |
| 2005/0228939 A1 | 10/2005 | Janzen | 711/105 |
| 2005/0257021 A1 | 11/2005 | James | 711/170 |
| 2005/0268060 A1 | 12/2005 | Cronin et al. | 711/167 |
| 2006/0023528 A1 | 2/2006 | Pax et al. | 365/202 |
| 2006/0047891 A1 | 3/2006 | James et al. | 711/105 |
| 2006/0179203 A1 | 8/2006 | Jeddeloh | 710/311 |
| 2006/0179208 A1 | 8/2006 | Jeddeloh | 711/100 |
| 2006/0200598 A1 | 9/2006 | Janzen | 710/58 |

| | | | | |
|---|---|---|---|---|
| 2006/0204247 A1 | 9/2006 | Murphy | | 398/139 |
| 2006/0206667 A1 | 9/2006 | Ryan | | 711/115 |
| 2006/0206742 A1 | 9/2006 | James | | 713/503 |
| 2006/0218331 A1 | 9/2006 | James | | 710/305 |
| 2006/0271720 A1 | 11/2006 | James et al. | | 710/306 |
| 2007/0025133 A1 | 2/2007 | Taylor | | 365/63 |
| 2007/0035980 A1 | 2/2007 | Taylor | | 365/63 |
| 2008/0162861 A1 | 7/2008 | Jobs et al. | | 711/170 |

FOREIGN PATENT DOCUMENTS

| | | |
|---|---|---|
| JP | 2001265539 A | 9/2001 |
| WO | WO 93/19422 | 9/1993 |
| WO | WO 02/27499 A2 | 4/2002 |

OTHER PUBLICATIONS

Omkar et al., "*Neural Network Controller for Minimizing Hub Shear Forces in Helicopter*", IEEE XPLORE, Sep. 1998 (Abstract Only).

Depari, A. et al., "*USB Sensor Network For Industrial Applications*", IEEE XPLORE, May 2004 (Abstract Only).

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

Gillett, R. et al., "*Using The Memory Channel Network*", Micro IEEE, vol. 17, Issue 1, Jan.-Feb. 1997 (Abstract Only).

Gommans et al., "*Applications Drive Secure Lightpath Creation Across Heterogeneous Domains*", Communications Magazine, IEEE, +-vol. 44, Issue 3, Mar. 2006 (Abstract Only).

Hsieh et al., "*On The Design Of A Local Switch For Heterogenous Multi-subsystem Interconnected*", IEEE XPLORE, Oct. 1993 (Abstract Only).

Intel, "Flash Memory PCI Add-In Card for Embedded Systems", Application Note AP-758, Sep. 1997, pp. i-13.

Intel, "Intel 840 Chipset: 82840 Memory Controlled Hub (MCH)", Datasheet, www.intel.com/design/chipsets/datashts/298020.htm, Oct. 1999, pp. 1-178.

Micron Technology, Inc., "Synchronous DRAM Module 512MB/1 GB (×72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

Scott, Noel D. et al., "An Overview of the Visualize fx Graphics Accelerator Hardware," The Hewlett-Packard Journal, Article 4, May 1998, pp. 28-34.

Clugston, Mike, Definition of "cache", 2004, www.xreferplus.com.

\* cited by examiner

US 7,546,435 B2

DYNAMIC COMMAND AND/OR ADDRESS MIRRORING SYSTEM AND METHOD FOR MEMORY MODULES

CROSS-REFERENCE TO RELATED APPLICATION

This application is a continuation of pending U.S. patent application Ser. No. 10/773,518, filed Feb. 5, 2004.

TECHNICAL FIELD

This invention relates to memory modules having memory devices mounted on opposite surfaces of a substrate, and more particularly to memory modules having memory devices on opposite surfaces of a substrate.

BACKGROUND OF THE INVENTION

Semiconductor devices, such as memory devices, are normally in the form of a semiconductor substrate or chip mounted in a hermetically sealed package. An integrated circuit fabricated on the chip is then coupled to terminals that are accessible from outside the package. These externally accessible terminals can assume many forms, such as pins projecting outwardly and then downwardly along opposite sides of the integrated circuit package and terminal pads arranged in a group on the bottom of the integrated circuit package, which is known as a ball grid array, or "BGA" configuration.

Each externally accessible terminal of the integrated circuit package is normally associated with a particular function. For example, in an integrated memory device, a first set of externally accessible terminals are input terminals for respective memory address bits $A_0$-$A_N$, and a second set of externally accessible terminals are input terminals for respective command or status signals $C_0$-$C_N$, such as RAS*, CAS*, and a clock signal. A third set or externally accessible terminals are input/output terminals for respective data bits $D_0$-$D_N$. Finally, a fourth set of externally accessible terminals are reserved for power and ground.

Although integrated circuits are commonly used singly in many applications, other types of integrated circuits are most commonly used in groups. For example, memory devices in general, and dynamic random access memory ("DRAM") devices in particular, are commonly used in groups as part of memory modules. Memory modules are generally in the form of an insulative substrate, such as a printed circuit board, having several memory devices mounted on one or both surfaces of the substrate. Conductors couple the memory devices to connectors that are generally formed by terminals extending along an edge of the substrate. One common memory module is a single in-line memory module, known as a "SIMM," which includes a single row of memory devices extending across one or both surfaces of the substrate. Another common memory module is a double in-line memory module, known as a "DIMM," which includes two rows of memory devices extending across one or both surfaces of the substrate.

A common phenomena associated with memory modules, whether SIMMs, DIMMs or some other variety, is the need for an ever increasing storage capacity. For this reason, the capacity of the memory devices mounted on the substrate, as well as the number of externally accessible terminals needed to address the memory devices, has continuously increased. The need for increased memory capacity also increases the need for memory modules having a larger number of memory devices. As a result, memory devices are now usually mounted on both sides of a memory module substrate, and the spacing between memory devices has continued to decrease. The decreased spacing between memory devices and the increased number of terminals has made it more difficult to route conductors to the externally accessible terminals of the memory devices.

One technique that has been used successfully to route conductors to a large number of terminals of closely spaced memory devices is to use substrates having a large number of layers on which conductors are formed. However, it is relatively expensive to provide substrates having a large number of layers, and a large number of closely spaced layers can result in excessive cross-talk between conductors on different layers and excessive conductor capacitance.

Another technique that has made it easier to route conductors to memory device terminals is mirroring in which the terminals of each memory device mounted on one surface of the substrate are position directly opposite corresponding terminals of a memory device mounted on the opposite surface of the substrate. This mirroring can occur horizontally, in which corresponding terminals are at the same locations on opposite sides of the mirrored packages, or vertically, in which corresponding terminals are at the same locations above and below a line extending across and bisecting the mirrored packages. In either case, mirroring has the advantage of allowing conductors to extend to a single respective location on the substrate, and to then connect to a respective terminal on each surface of the substrate at that location. Significantly, there is no need to route a conductor coupled to a terminal of an integrated circuit on one surface of the substrate to a different location for coupling to the corresponding terminal of an integrated surface on the other surface of the substrate.

Although memory device mirroring has the advantage of allowing more compact routing of conductors to the memory devices, it is not without some disadvantages. For memory device mirroring to occur, two different integrated circuit packages must be developed so that corresponding terminals of the two packages are mirror images of each other. The two different packages can theoretically use the same integrated circuit chip, but, in practice, this is not always feasible. In particular, it is important that the integrated circuits on one surface of the substrate respond to signals in the same manner as the integrated circuits on the opposite surface of the substrate. For the circuits to respond in the same manner, it is important for the lengths of corresponding signal paths of the two circuits be identical. Not only is it sometimes difficult to route signal lines from a circuit node to either of two different terminals, doing so creates an undesirable stub connection to the signal path between the terminal and the circuit node. This stub connection can produce signal reflections that can degrade the performance of the integrated circuit. For this reason, it can be necessary to fabricate two different integrated circuit chips, which are the mirror images of each other, for placement in the respective mirrored packages. The need to develop and stock two different integrated circuit packages, even if the same chip can be used for both packages, can significantly increase the cost of mirrored integrated circuits.

To alleviate the above-described problems of mirroring integrated circuits, programmable integrated circuits have been developed. With reference to FIG. 1, an integrated circuit memory device 10 includes a large number of terminals, although only terminals 12, 14 for RAS and CAS signals are shown. The RAS and CAS signals are horizontally mirrored, as explained above. The terminals 12, 14 are each coupled to a respective input of two multiplexers 16, 18. The output of the multiplexer 16 is coupled to a RAS signal node 20, and the output of the multiplexer 18 is coupled to a CAS signal node 22. The multiplexers 16, 18 are controlled by a signal line coupled to an external terminal 26 at a predetermined location. The terminal 12 is coupled to a first input of the multiplexer 16 and to a second input of the multiplexer 18. The terminal 14 is coupled to a second input of the multiplexer 16 and to a first input of the multiplexer 18. As a result, a low applied to the terminal 26 causes the terminal 12 to be coupled to the RAS signal node 20, and the terminal 14 to be coupled to the CAS signal node 22. A high applied to the terminal 26 causes the terminal 12 to be coupled to the CAS signal node 22, and the terminal 14 to be coupled to the RAS signal node 20.

In operation, two of the integrated circuit memory devices 10a,b are mounted on opposite surfaces of a substrate as shown in FIGS. 2A and 2B, respectively. As a result, the RAS signal is coupled to the terminal 12 of the memory devices 10a and the terminal 14 of the memory device 10b. The CAS signal is coupled to the terminal 14 of the memory devices 10a and the terminal 12 of the memory device 10b. However, the terminal 26 of the memory device 10a is coupled to ground potential, and the terminal 26 of the memory device 10b is coupled to a supply voltage. Therefore, the multiplexer 16 (FIG. 1) couples the RAS signal to the RAS signal node 20 of both memory devices 10a,b, and the multiplexer 18 couples the CAS signal to the CAS signal node 22 of both memory devices 10a,b.

The technique explained with reference to FIGS. 1 and 2A,B has the advantage of allowing mirroring to occur using a single integrated circuit mounted on opposite sides of a substrate, and avoids many of the above-mentioned disadvantages of using two different integrated circuits. However, mirroring using an internal routing circuit, such as the multiplexers 16, 18 shown in FIG. 1, has the disadvantage of requiring that a routing circuit for each terminal be fabricated on a semiconductor substrate, thereby using area that could be used for the integrated circuit itself. As a result, the use of routing circuits can significantly increase the cost of memory devices, particularly in view of the large number of terminals present in memory devices that each require a routing circuit, as well as the large number of memory devices included in many systems. The routing circuits can also introduce undesirable delays in the coupling of the RAS and CAS signals to their respective nodes 20, 22.

Another problem in routing conductors to memory devices in memory modules occurs when the memory module includes a memory hub or register through which signals are routed to and from the memory devices. As shown in FIG. 3, a memory module 30 includes memory hub 32 mounted on a substrate 34. The memory module 30 also includes a plurality of memory devices mounted on the substrate 34, two of which 38, 40 are shown in FIG. 3. In the memory module 30 of FIG. 3, each signal transmitted and received by the memory hub 32 is transmitted and received on a first set of terminals coupled to the memory device 38 on the left of the substrate 34 and a second set of terminals coupled to the memory device 40 on the right side of the substrate 34. One of the signals transmitted by the memory hub, i.e., the $A_0$ address bit, is shown in FIG. 3, and this address bit is coupled to correspondingly positioned terminals of the memory devices 38, 40. However, since the $A_0$ terminal is located on the left side of both memory devices 38, 40, the path to the $A_0$ terminal of the left memory device 38 is longer than the path to the $A_0$ terminal of the right memory device 40. As a result, the performance of the two memory devices 38, 40 may not be symmetrical. A similar problem exists when coupling signals from between memory devices and a register (not shown) of a registered memory module.

The above-described difficulties incurred in coupling signals to and from integrated circuits, such as memory devices, creates a need for a mirroring technique that allows a single integrated circuit to be mounted on opposite surfaces of a substrate with correspondingly positioned terminals coupled together, and which does not require internal routing circuitry in each memory device.

SUMMARY OF THE INVENTION

A memory module according to one aspect of the invention includes an insulative substrate; on which a plurality of identical memory devices mounted on first and second opposed surfaces of the insulative substrate. The memory devices are mounted on the substrate in a mirrored configuration. As a result, a plurality of terminals of each of the memory devices mounted on the first surface are interconnected to respective, correspondingly positioned terminals of a respective one of the memory devices mounted on the second surface. Address and command signals are coupled to the interconnected terminals. Significantly, either the address signals, the command signals or both the address and command signals are coupled to the interconnected terminals for a plurality of the memory devices in a first configuration if the memory devices mounted on the first surface of the substrate are being accessed. In contrast these signals are coupled to the interconnected terminals for a plurality of the memory devices in a second configuration that is different from the first configuration if the memory devices mounted on the second surface of the substrate are being accessed. The memory devices in one or more memory modules may be coupled to a memory controller that alters the configuration of the signals as indicated above. Alternatively, the configuration of the signals may be altered by either a memory hub or a register mounted on each of the memory modules.

DETAILED DESCRIPTION OF THE INVENTION

Figure 1:
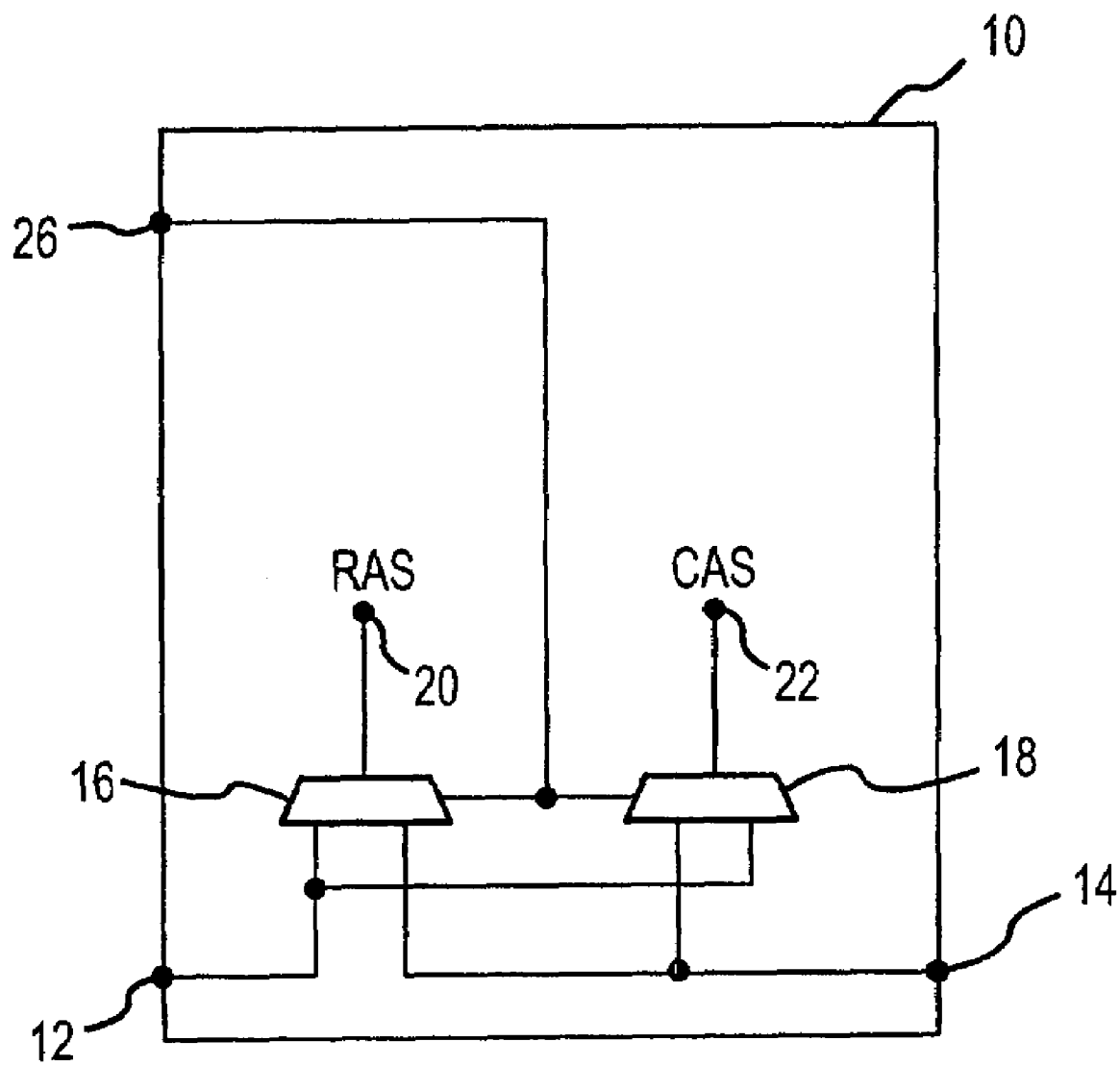
FIG. 1 is a block diagram of a conventional integrated memory device that can be used in a memory module in mirrored fashion.
Figure 2A:
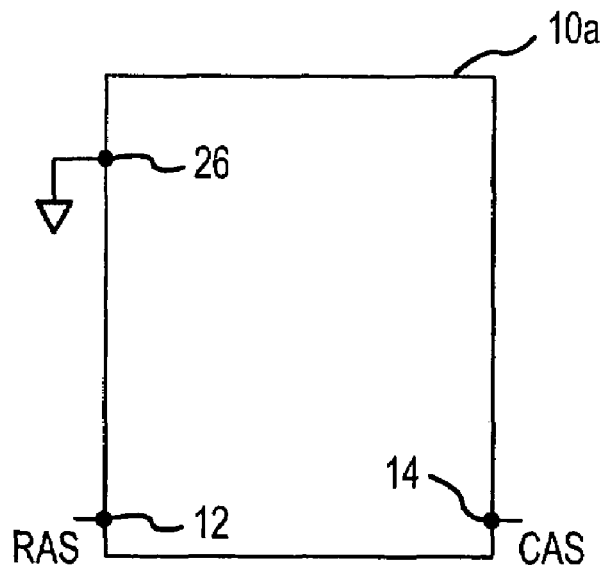
FIGS. 2A and 2B are terminal diagrams showing the routing of some of the signals for the memory device of FIG. 1 when they are mounted on opposite surfaces of a memory module substrate.
Figure 2B:
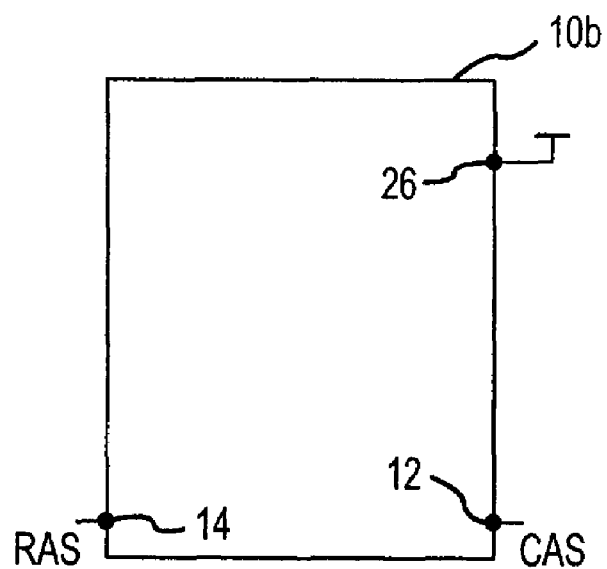
Figure 3:
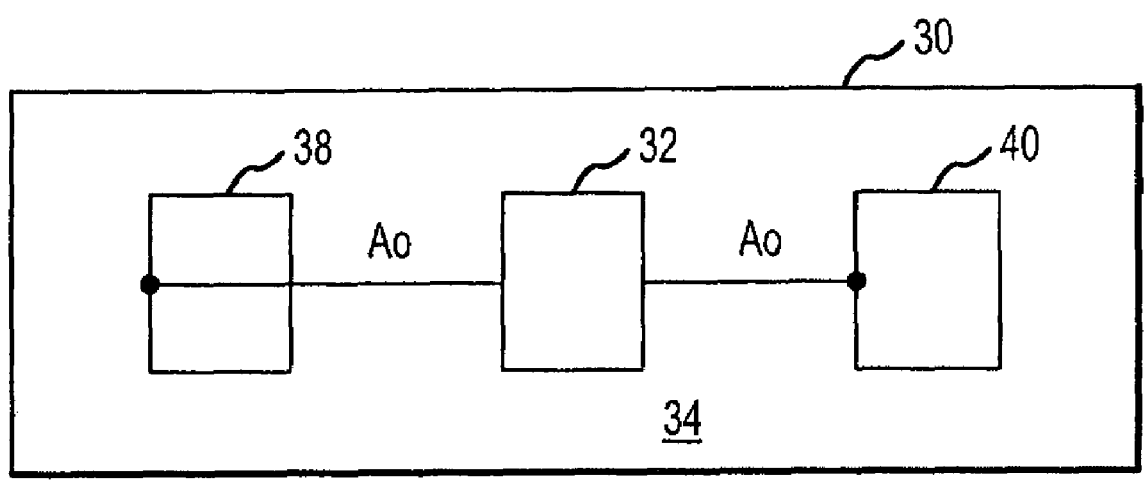
FIG. 3 is a plan view of a conventional memory module including a memory hub coupled to memory devices on opposite sides of the memory hub.
Figure 4:
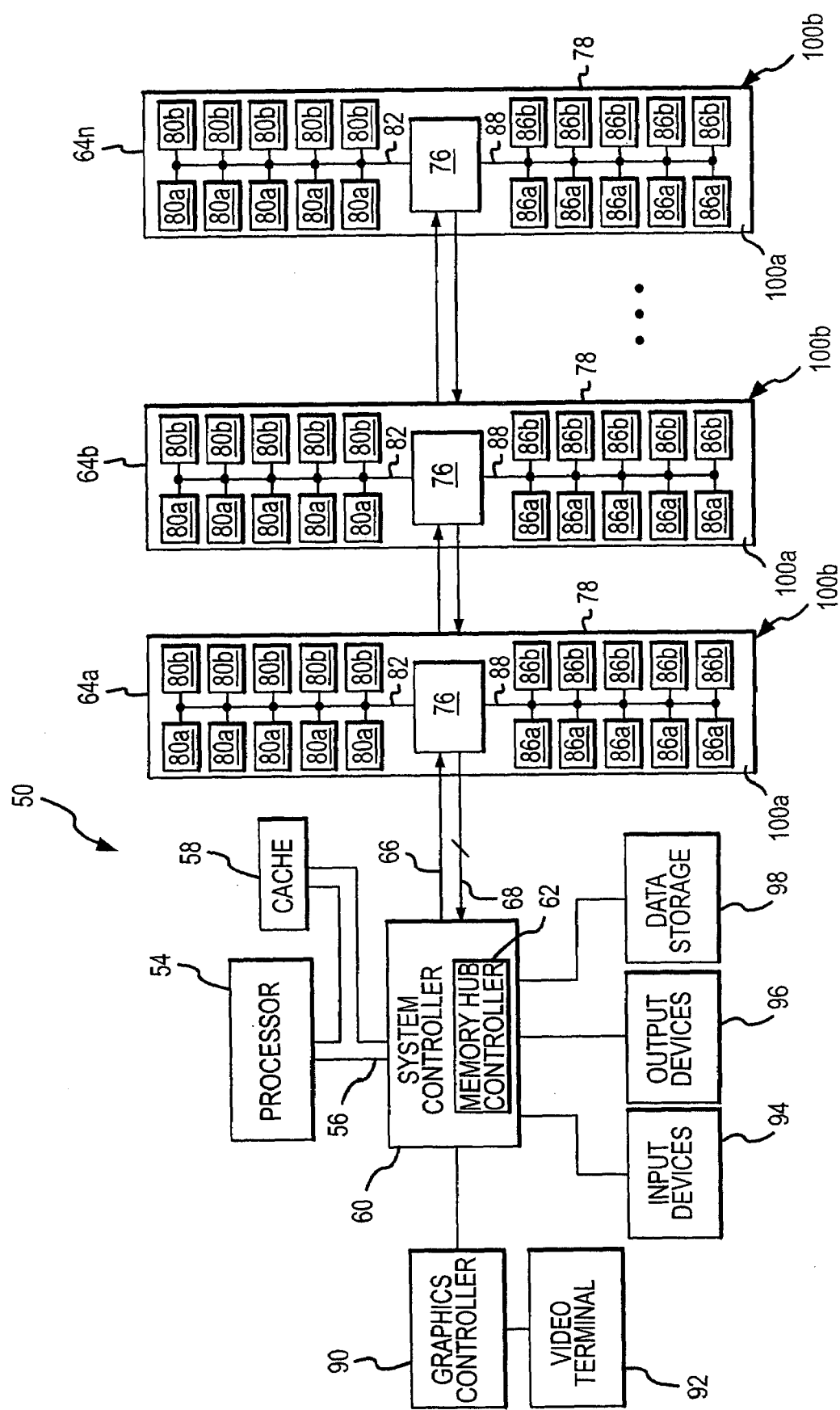
FIG. 4 is a block diagram of a computer system including several memory modules according to one embodiment of the invention.

A computer system 50 according to one embodiment of the invention is shown in FIG. 4. The computer system 50 includes a processor 54 for performing various computing functions, such as executing specific software to perform specific calculations or tasks. The processor 54 includes a processor bus 56 that normally includes an address bus, a control bus, and a data bus. The processor bus 56 is typically coupled to a cache memory 58, which, is typically static random access memory ("SRAM") device. Finally, the processor bus 56 is coupled to a system controller 60, which is also sometimes referred to as a bus bridge.

The system controller 60 contains a memory hub controller 62 that is coupled to the processor 54. The memory hub controller 62 is also coupled to several memory modules 64a-n, and the memory modules 64a-n are coupled to each other, through a downstream bus 66 and an upstream bus 68, which couple data, address and/or control signals away from or toward, respectively, the memory hub controller 62. Each of the memory modules 64a-n includes a memory hub 76 mounted on a substrate 78. The memory hub 76 is coupled to several memory devices 80a,b on one side of the memory module 64 through a first set of command, address and data buses 82, and to several memory devices 86a,b on the other side of the memory module 64 through a second set of command, address and data buses 88. The memory devices 80a,b and 86a,b are identical to each other. The memory hub 76 efficiently routes memory requests and responses between the memory hub controller 62 and the memory devices 80, 86. Computer systems employing this architecture can have a higher bandwidth because the processor 54 can access one memory module 64a-n while another memory module 64a-n is responding to a prior memory access. For example, the processor 54 can output write data to one of the memory modules 64a-n in the system while another memory module 64a-n in the system is preparing to provide read data to the processor 54. The operating efficiency of computer systems using a memory hub architecture can make it more practical to vastly increase data bandwidth of a memory system. A memory hub architecture can also provide greatly increased memory capacity in computer systems.

The system controller 60 also serves as a communications path to the processor 54 for a variety of other components. More specifically, the system controller 60 includes a graphics port that is typically coupled to a graphics controller 90, which is, in turn, coupled to a video terminal 92. The system controller 60 is also coupled to one or more input devices 94, such as a keyboard or a mouse, to allow an operator to interface with the computer system 50. Typically, the computer system 50 also includes one or more output devices 96, such as a printer, coupled to the processor 54 through the system controller 60. One or more data storage devices 98 are also typically coupled to the processor 54 through the system controller 60 to allow the processor 54 to store data or retrieve data from internal or external storage media (not shown). Examples of typical storage devices 98 include hard and floppy disks, tape cassettes, and compact disk read-only memories (CD-ROMs).

With further reference to FIG. 4, the memory devices 80a and 86a are mounted on a first surface 100a of the substrate 78, and the memory devices 80b and 86b are mounted on a second surface 100b of the substrate 78. The memory devices 80a, 86a are preferably mounted directly opposite the memory devices 80b, 86b, respectively, and their adjacent terminals are coupled to each other and to signal lines of the buses 82, 88, respectively. As a result, a terminal located at the upper left-hand corner of one of the memory devices 80a is coupled to a correspondingly positioned terminal located at the upper right-hand corner of the opposing memory device 80b, for example.

The terminals of the memory devices 80, 86 are preferably arranged so that data bus terminals of the memory devices 80a, 86a are coupled to data bus terminals of the memory devices 80b, 86b, respectively, on the opposite surface of the substrate 78. Data signals applied to the interconnected terminals of the memory devices will therefore be written to the memory devices 80a, 86a mounted on the first surface 100a as data bits that are different from the data bits written to the memory devices 80b, 86b mounted on the second surface 10b. For example, a data signal for data bit $D_1$ may be written to a memory device 80a as a $D_1$ bit and written to a memory device 80b as a $D_{15}$ bit. However, when the same data signals are read from the memory devices 80a and 80b, the data signal will be coupled to the signal line for the $D_1$ data bit even though the data signal was read from the $D_{15}$ bit of the memory device 80b. Therefore, as long as the data bus terminals of the memory devices 80a, 86a are coupled to the data bus terminals of the memory devices 80b, 86b, respectively, data will be properly written to and read from the memory devices 80, 86, assuming that all of the data bus terminals to which the data bits are coupled are associated with the same data strobe signal.

Unlike the data bus terminals of the memory devices 80, 86, the address and control bus terminals of the memory devices 80, 86 are not interchangeable. Therefore, an address signal coupled to a terminal of the memory device 80a cannot be simply coupled to a correspondingly positioned terminal of an opposing memory device 80b. Instead, each address and control signal must be coupled to a specific terminal of each of the memory devices 80, 86 regardless of the location of the memory devices. Rather than using the conventional approaches of using different memory devices having different terminal configurations or routing signals to the proper signal nodes, the address and control signals are coupled to the proper terminals of the memory devices 80, 86 by the memory hub 76 coupling different signals to the same lines of the buses 82, 88 depending upon which memory device 80, 86 is being accessed. For example, if the $A_0$ address bit of the memory device 80a is connected to the $A_{10}$ address bit of the opposing memory device 80b, the memory hub 76 will couple an address signal for bit $A_0$ to a specific signal line of the bus 82 if the memory device 80a is being addressed, and it may couple an address signal for bit $A_{10}$ to the same signal line of the bus 82 if the memory device 80b is being addressed. Conversely, the memory device will couple an address signal for bit $A_0$ to one signal line of the bus 82 if the memory device 80a is being addressed, and it will couple the address signal for bit $A_0$ to another signal line of the bus 82 if the memory device 80b is being addressed. Different address and control signals are also coupled to the same lines of the bus 88 depending on whether memory device 86a or 86b is being accessed.

The memory devices 80, 86 may be either of two types of memory devices each of which operates in either of two modes. Furthermore, the memory devices 80, 86 have different terminal assignments depending on which mode of operation is used by the memory devices 80, 86. For example, as is known to one skilled in the art, DRAM memory devices operating in one double data rate ("DDR") mode known as the "DDR2" mode use one set of terminal assignments, and, DRAM memory devices operating in another DDR mode known as the "DDR3" mode, use another set of terminal assignments. For example, the same terminal to which an $A_5$ address bit is coupled to memory devices operating in the DDR2 mode will receive an $A_{12}$ address bit for memory devices operating in the DDR3 mode. In each case, the memory hub 76 will couple the proper signal to each signal line of each of the buses 82, 88 depending on: (1) whether the memory devices 80, 86 are of the type that operate in the DDR2 mode or the DDR3 mode; (2) whether the memory devices 80, 86 are to the left of the memory hub 76 and are thus coupled to the hub 76 through the bus 82 or to the right of the memory hub 76 and are thus coupled to the hub 76 through the bus 88; and (3) whether the memory devices 80, 86 are mounted on the first surface 100a of the substrate 78 or the second surface 100b of the substrate 78.

In one embodiment of the invention, the memory hub 76 will couple signal to the memory devices 80, 86 according to Table 1 below in which $A_0$-$A_{16}$ are row and column addresses, $BA_0$-$BA_3$ are bank addresses, CASZ is an active low column address strobe signal, CSZ0 and CSZ1 are active low chip select signals to select memory devices 80, 86 on the first surface 100a and second surface 100b, respectively, ODT0 and ODT1 are signals, RASZ is an active low row address strobe signal and WEZ is an active low write enable signal.

TABLE 1

| Hub Left Terminal Location | Hub Right Terminal Location | 82a, 86a DDR2 $CS_0$ | 82b, 86b DDR2 $CS_1$ | 82a, 86a DDR3 $CS_0$ | 82b, 86b DDR3 $CS_1$ |
|---|---|---|---|---|---|
| $C_5$ | $C_{27}$ | $A_0$ | $A_{10}$ | $A_3$ | $A_0$ |
| $C_{11}$ | $B_{21}$ | $A_1$ | $A_2$ | $A_6$ | $A_5$ |
| $C_6$ | $C_{26}$ | $A_2$ | $A_1$ | $BA_3$ | $BA_2$ |
| $C_{12}$ | $B_{20}$ | $A_3$ | $A_4$ | $A_2$ | $A_1$ |
| $B_5$ | $B_{27}$ | $A_4$ | $A_3$ | $A_1$ | $A_2$ |
| $B_{11}$ | $A_{21}$ | $A_5$ | $A_6$ | $A_{12}$ | $A_{13}$ |
| $B_6$ | $B_{26}$ | $A_6$ | $A_5$ | $A_5$ | $A_6$ |
| $B_{12}$ | $C_{19}$ | $A_7$ | $A_8$ | $A_7$ | $A_8$ |
| $A_5$ | $B_{29}$ | $A_8$ | $A_7$ | $A_8$ | $A_7$ |
| $A_{13}$ | $A_{19}$ | $A_9$ | $A_{11}$ | $A_9$ | $A_{11}$ |
| $D_{12}$ | $C_{21}$ | $A_{10}$ | $A_0$ | $BA_2$ | $BA_3$ |
| $A_4$ | $A_{29}$ | $A_{11}$ | $A_9$ | $A_{11}$ | $A_9$ |
| $A_{12}$ | $A_{20}$ | $A_{12}$ | $A_{13}$ | $A_4$ | $A_{14}$ |
| $A_6$ | $A_{27}$ | $A_{13}$ | $A_{12}$ | $A_{13}$ | $A_{12}$ |
| $A_{11}$ | $A_{22}$ | $A_{14}$ | $A_{15}$ | $A_{15}$ | $A_{15}$ |
| $A_7$ | $A_{28}$ | $A_{15}$ | $A_{14}$ | $A_{14}$ | $A_4$ |
| $A_{10}$ | $A_{23}$ | $A_{16}$ | $A_{16}$ | $A_{16}$ | $A_{16}$ |
| $D_7$ | $D_{27}$ | $BA_0$ | $BA_0$ | $BA_1$ | $BA_0$ |
| $E_{13}$ | $D_{20}$ | $BA_1$ | CASZ | $A_{10}$ | WEZ |
| $E_7$ | $E_{25}$ | $BA_2$ | $BA_2$ | $CSZ_1$ | $CSZ_1$ |
| $F_{12}$ | $F_{22}$ | $BA_3$ | $BA_3$ | $ODT_1$ | $ODT_1$ |
| $D_8$ | $D_{26}$ | CASZ | $BA_1$ | CASZ | RASZ |
| $D_6$ | $D_{28}$ | $CSZ_0$ | $CSZ_O$ | WEZ | $A_{10}$ |
| $D_{11}$ | $D_{21}$ | $CSZ_1$ | $CSZ_1$ | $BA_0$ | $BA_1$ |
| $C_9$ | $E_{28}$ | $ODT_0$ | $ODT_0$ | $ODT_0$ | $ODT_0$ |
| $D_{13}$ | $C_{20}$ | $ODT_1$ | $ODT_1$ | $A_0$ | $A_3$ |
| $F_9$ | $E_{22}$ | RASZ | WEZ | $CSZ_0$ | $CSZ_0$ |
| $E_{10}$ | $D_{22}$ | WEZ | RASZ | RASZ | CASZ |

In one embodiment, the memory hub 76 has externally accessible terminals arranged in a grid, and the location of each terminal is designated by a letter designating the row of the terminal and a number designating the column of the terminal. For example, A1 is a terminal located at the upper left hand corner of the memory hub 76, and F29 is a terminal located at the lower right hand corner of the memory hub 76. The locations of these terminals that are coupled to the memory devices 80 through the bus 82 are listed in the first column of Table 1, and the locations of these terminals that are coupled to the memory devices 86 through the bus 88 are listed in the second column of Table 1. The signals applied to the terminals of the memory hub 76 when the memory devices 82a, 86a on the first surface 100a of the substrate 78 are being accessed and the devices 82a, 86a are of the type operating in the DDR2 mode are listed in the third column of Table 1. The signals applied to the terminals of the memory hub 76 when the memory devices 82b, 86b on the second surface 100b are being accessed and the devices 82b, 86b are of the type operating in the DDR2 mode are listed in the fourth column of Table 1. The signals applied to the terminals of the memory hub 76 when the memory devices 82a, 86a are of the type operating in the DDR3 mode and are being accessed are listed in the fifth column of Table 1. Finally, the signals applied to the terminals of the memory hub 76 when the memory devices 82b, 86b are of the type operating in the DDR3 mode and are being accessed are listed in the sixth column of Table 1.

For example, the C5 terminal of the memory hub 76, which is coupled to a signal line of the bus 82, receives the $A_0$ address bit when the memory devices 80a are being accessed and they are of the type operating in the DDR2 mode, and it receives the $A_3$ address bit when the memory devices 80a are being accessed and they are of the type operating in the DDR3 mode. If the memory devices 86a are being accessed, the C27 terminal of the memory hub 76, which is coupled to a signal line of the bus 88, receives the $A_0$ address bit when the memory devices 86a are being accessed and they are of the type operating in the DDR2 mode, and it receives the $A_3$ address bit when the memory devices 80a are being accessed and they are of the type operating in the DDR3 mode. If the memory devices 80b are being accessed, the C5 terminal of the memory hub 76, which is coupled to a signal line of the bus 82, receives the $A_{10}$ address bit when the memory devices 80b are of the type operating in the DDR2 mode, and it receives the $A_0$ address bit when the memory devices 80b are being accessed and they are of the type operating in the DDR3 mode. If the memory devices 86b are being accessed, the C27 terminal of the memory hub 76, which is coupled to a signal line of the bus 88, receives the $A_{10}$ address bit when the memory devices 80b are of the type operating in the DDR2 mode, and it receives the $A_0$ address bit when the devices 80b are being accessed and they are of the type operating in the DDR3 mode.

The routing of signals to the terminals of the memory devices 80, 86 based on whether they are of the type operating in the DDR2 or the DDR3 mode is static since it does not change during the operation of the memory devices 80, 86. However, the routing of signals from either the left set of terminals A1-F13 of the memory hub 76 to the memory devices 80 or from right set of terminals A19-29 of the memory hub 76 and to the memory devices 86 is dynamic, and therefore changes rapidly while the memory devices 80, 86 are being accessed.

Although the address and most of the control signals must be dynamically mirrored, in one embodiment some control signals can be applied to multiple symmetrically positioned terminals of the memory device 80, 86 so that dynamic mirroring is not required. For example, a first clock enable CKE signal is applied to a terminal of the memory device 80, and a second clock enable CKE signal is applied to a terminal of the memory device 86 regardless of whether the memory devices 80, 86 are of the type operating in the DDR2 or the DDR3 mode. Regardless of which memory device 80, 86 is being addressed, the addressed memory device will receive a CKE signal at the appropriate terminal. The signals for which dynamic mirroring is not required, as well as the locations of the terminals of the memory hub 76 to which those signals are applied in one embodiment, are listed in Table 2, below.

TABLE 2

| Hub Left Terminal Location | Hub Right Terminal Location | 82a, 86a DDR2 $CS_0$ | 82b, 86b DDR2 $CS_1$ | 82a, 86a DDR3 $CS_0$ | 82b, 86b DDR3 $CS_1$ |
|---|---|---|---|---|---|
| $D_9$ | $E_{19}$ | $CKE_O$ | $CKE_O$ | $CKE_O$ | $CKE_O$ |
| $F_6$ | $E_{29}$ | $CKE_1$ | $CKE_1$ | $CKE_1$ | $CKE_1$ |

TABLE 2-continued

| Hub Left Terminal Location | Hub Right Terminal Location | 82a, 86a DDR2 $CS_0$ | 82b, 86b DDR2 $CS_1$ | 82a, 86a DDR3 $CS_0$ | 82b, 86b DDR3 $CS_1$ |
|---|---|---|---|---|---|
| $F_8$ | $F_{26}$ | $CLK_O$ | $CLK_O$ | $CLK_O$ | $CLK_O$ |
| $G_{11}$ | $G_{24}$ | $CLK_1$ | $CLK_1$ | $CLK_1$ | $CLK_1$ |
| $F_7$ | $F_{25}$ | $CLKZ_0$ | $CLKZ_0$ | $CLKZ_0$ | $CLKZ_0$ |
| $G_{12}$ | $G_{23}$ | $CLKZ_1$ | $CLKZ_1$ | $CLKZ_1$ | $CLKZ_1$ |
| $F_{13}$ | | | | RESET | RESET |

Figure 5:
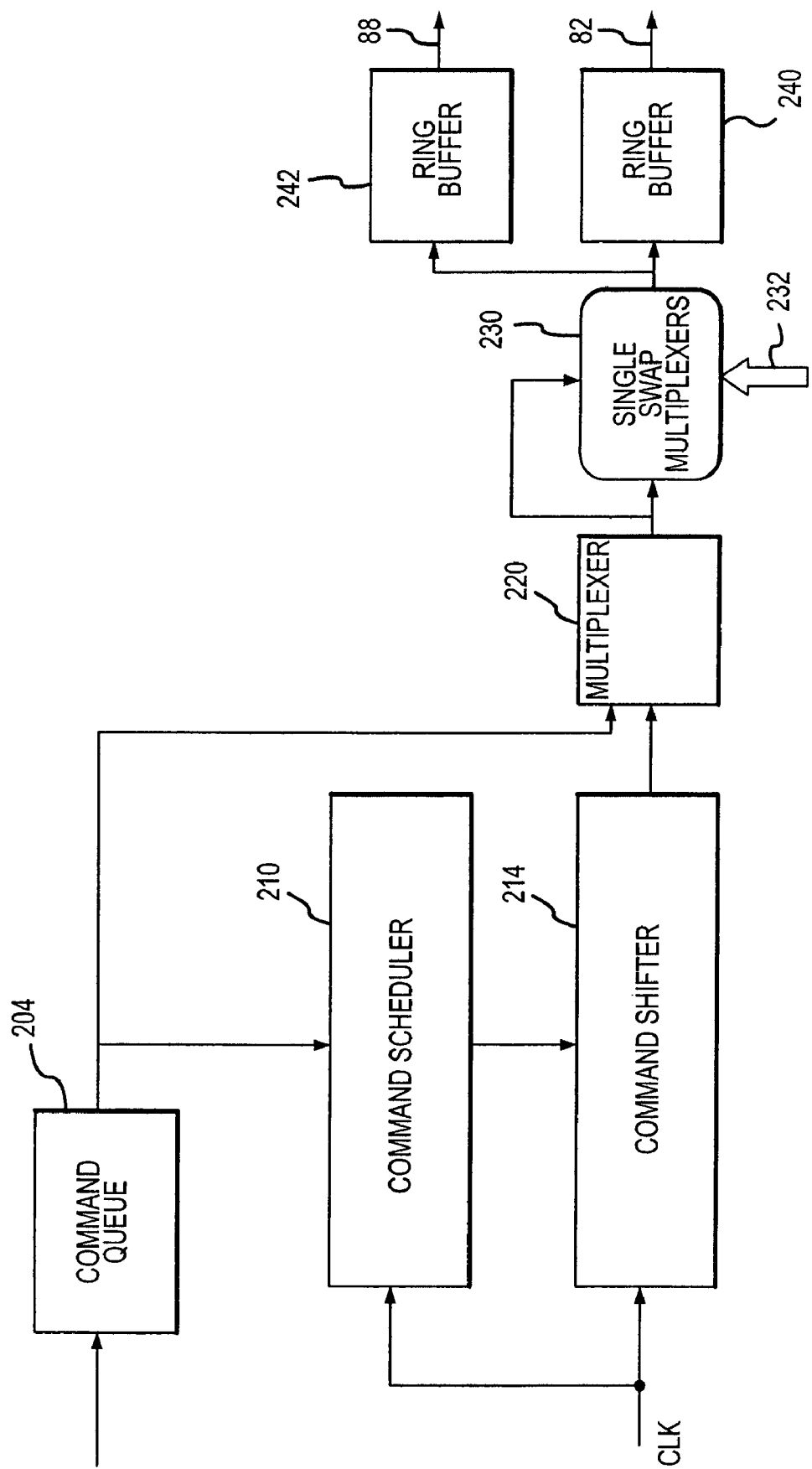
FIG. 5 is a block diagram of one embodiment of a memory controller that may be used in the computer system of FIG. 4.

The memory hub 76 used in the memory modules 64a-n of FIG. 4 includes a memory controller, and one embodiment of a memory controller 200 that can be used is shown in FIG. 5. Briefly, the memory controller 200 receives high-level macro commands, such as ACTIVATE ROW, COLUMN, and PRE-CHARGE, converts these commands to DRAM commands, schedules the DRAM commands for outputting at the proper time, and routes the scheduled DRAM commands to the correct terminals of the memory hub 76, as previously explained. With reference to FIG. 5, the memory controller 200 includes a command queue 204 that receives the high-level macro commands from the memory hub controller 62 (FIG. 4). The Command Queue 204 translates the received macro commands to DRAM command signals, such as RASZ, CASZ, WEZ, etc., places the command signals in a queue in the order that their corresponding macro commands were received, and then outputs the commands in the proper order. The Command Queue 204 also receives address signals, which are placed in a queue in the order that they were received, and they are subsequently output in the proper order. The command and address signals that are output from the Command Queue 204 are the command and address signals listed in Tables 1 and 2.

The DRAM command signals and address signals from the Command Queue 204 are applied to a Command Scheduler 210, which spaces the command and address signals apart from each other with the proper delay. The delay is measured in periods of a clock CLK signal, which is also applied to the Command Scheduler 210. For example, the Command Scheduler 210 might schedules the CASZ to be output three clock periods after the RASZ signals was output from the Command Scheduler 210. When the command and address signals are output from the Command Scheduler 210, they are stored in a micro Command Shifter 214, which is basically a shift register that is driven by the CLK signal. The command and address signals are stored in the Command Shifter 214 in the proper order and with the proper spacing because they were shifted into the Command Shifter 214 from the Command Scheduler 210 in that manner.

When the properly timed and ordered command and address signals are shifted out of the Command Shifter 214 responsive to the CLK signal, they are applied to one input of a Multiplexer 220. The Multiplexer 220 also receives the DRAM command and address signals at a second input directly from the Command Queue 204. In operation, the Multiplexer 220 couples the command and address signals to its output directly from the Command Shifter 214 as these signals are received when the memory devices 80, 86 have been idle. As a result, the latency penalty that would be incurred in being coupled through the Command Scheduler 210 and the Micro Command Shifter 214 is avoided. After the initial command and address signals have been coupled to the output of the Multiplexer 220, the Multiplexer 220 selects the output of the Micro Command Shifter 214 for coupling to its output.

The command and address signals at the output of the Multiplexer 220 are applied to Signal Swap Multiplexers 230 that are controlled by a CONFIG command coupled to the Multiplexers 230 through a bus 232. The CONFIG command indicates whether the memory devices 80, 86 are of the type operating in the DDR2 or DDR3 modes. The Multiplexers 230 are also controlled by $CSZ_0$ and $CSZ_1$ signals, which indicate whether the memory devices 80a, 86a on the first surface 100a or the memory devices 80b, 86b on the second surface 100b are being accessed. The Signal Swap Multiplexers 230 can be implemented using a large number of individual multiplexers arranged in a matrix in a manner that will be apparent to one skilled in the art. The Signal Swap Multiplexers 230 route the command and address signals to the terminals of the memory hub 76 as shown in Tables 1 and 2.

The properly routed and timed command and address signals are coupled from the Signal Swap Multiplexers 230 to Ring Buffers 240, 242. The Ring Buffer 240 is coupled through the bus 82 (FIG. 4) to the memory devices 80 on the left hand side of the memory modules 64, and the Ring Buffer 242 is coupled through the bus 88 to the memory devices 86 on the right hand side of the memory modules 64. Each of the Ring Buffers 240, 242 is basically a first-in, first-out buffer that is driven by one of the clock signals $CLK_0$, $CLK_1$, $CLKZ_0$ or $CLKZ_1$ that is applied to the memory devices 80, 86. The command and address signals are therefore shifted from the Ring Buffers 240, 242 and applied to the terminals of the memory hub 76 in synchronism with the operation of the memory devices 80, 86.

Figure 6:
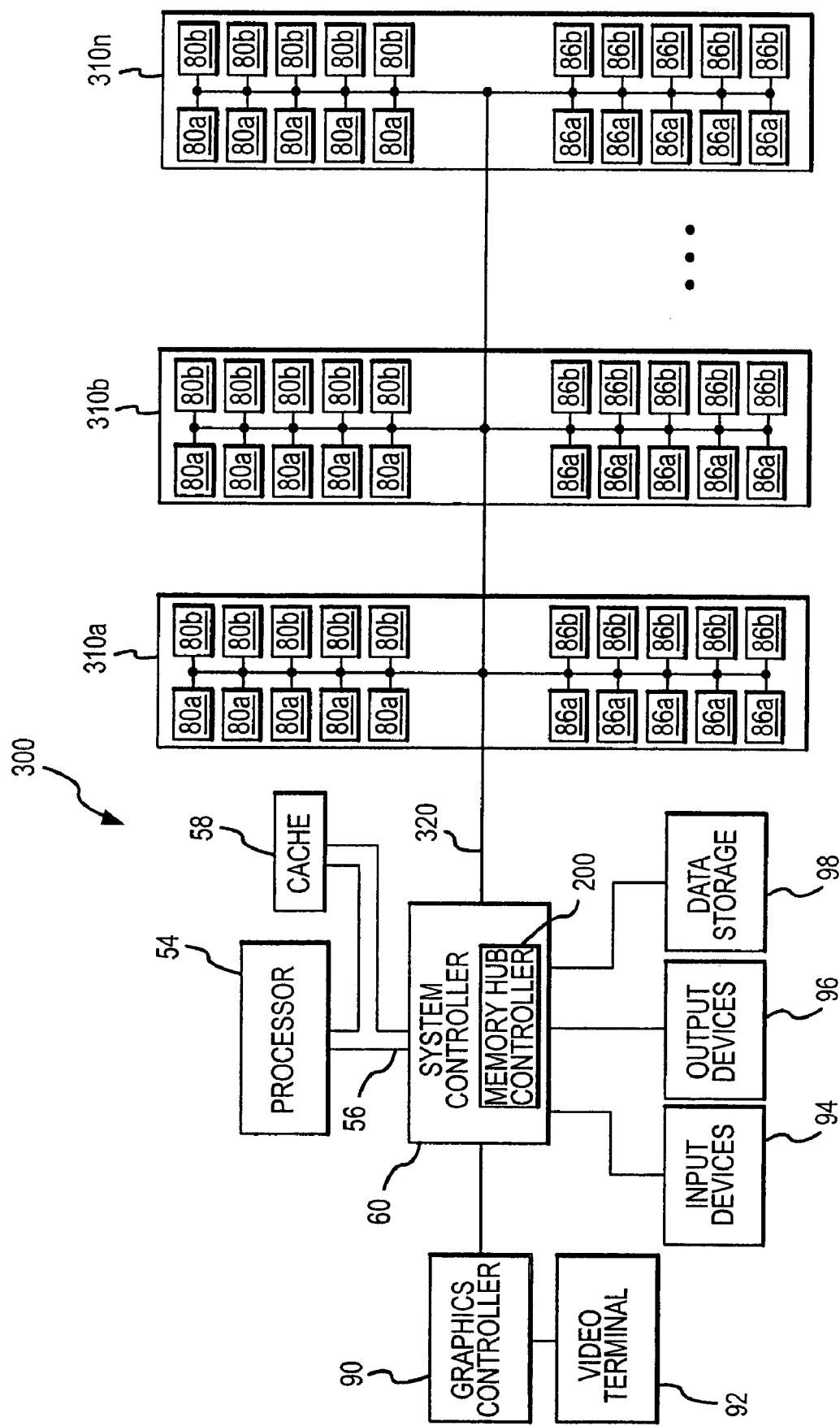
FIG. 6 is a block diagram of one embodiment of a computer system according to the present invention.

Although the memory controller 200 can be used in the memory hub 76 in the computer architecture shown in FIG. 4, it can also be used as a stand-along memory controller in the computer system 300 shown in FIG. 6. The computer system 300 uses many of the same components that are used in the computer system 50 of FIG. 4. Therefore, in the interests of brevity, these components have been provided with the same reference numerals, and an explanation of their operation will not be repeated. The computer system 300 differs from the computer system 50 by using memory modules 310 that do not contain a memory hub. Instead, the memory devices 80, 86 in each memory module 310 are coupled directly to the memory controller 200 in the system controller 60 through a memory bus 320. The memory controller 200 applies the command and address signals shown in Tables 1 and 2 to the signal lines of the bus 320 depending on which memory devices 80a, 86a, 80b or 86b are being accessed and whether the memory devices 80, 86 are of the type operating in either the DDR2 mode or the DDR3 mode, as explained above and as shown in Table 1.

Figure 7:
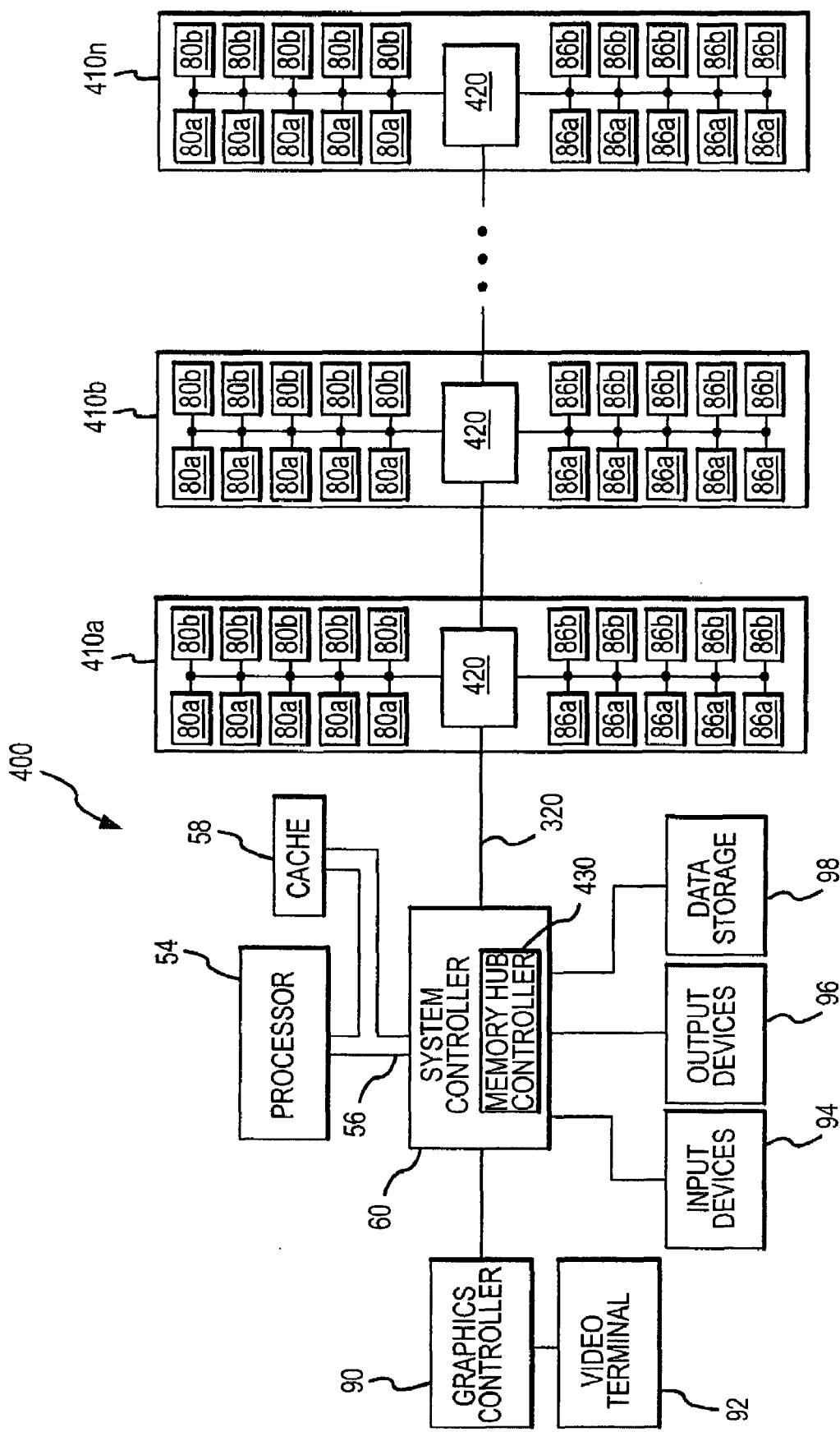
FIG. 7 is a block diagram of still another embodiment of a computer system according to the present invention.

Another embodiment of a computer system 400 according to the invention is shown in FIG. 7. The computer system 400 also uses many of the same components that are used in the computer systems 50 and 300 of FIGS. 4 and 6, respectively, and an explanation of the operation of these components will not be repeated. The computer system 400 differs from the computer system 300 by using memory modules 410 having registers 420 coupling the command and address signals to the memory devices 80, 86. Registered memory modules are well known in the art. The computer system 400 uses a memory controller 430 in the system controller 60 that may operate in the same manner as the memory controller 200 to apply the command and address signals to the registers 420 depending on which memory devices 80a, 86a, 80b or 86b are being accessed and whether the memory devices 80, 86 are of the type operating in either the DDR2 mode or the DDR3 mode. Alternatively, the memory controller 420 may operate in a conventional manner, and circuitry like the Signal Swap Multiplexers 230 shown in FIG. 5 may be included in each register 420 to apply the command and address signals to the memory devices 80, 86 depending on which memory devices 80a, 86a, 80b or 86b are being accessed and whether the memory devices 80, 86 are of the type operating in either the DDR2 mode or the DDR3 mode. Other variations will be apparent to one skilled in the art.

The various embodiments of the inventions have the advantage of routing the proper command and address signals to the memory devices 80, 86 at the memory controller level rather than at each of the memory device level. As a result, the number of circuits needed to perform this function is markedly less than if such circuitry was in each of the memory devices 80, 86. The various embodiments thus allow a mirroring with single memory device used on both surfaces of the substrate and on both the left and right sides of the substrate. From the foregoing it will be appreciated that, although specific embodiments of the invention have been described herein for purposes of illustration, it will be understood by one skilled in the art that various modifications may be made without deviating from the spirit and scope of the invention. For example, instead of using registered memory modules, circuitry like the Signal Swap Multiplexers 230 could simply be used on each memory module. Accordingly, the invention is not limited except as by the appended claims.

What is claimed is:

1. A memory module, comprising:
   an insulative substrate;
   first and second pluralities of memory devices each having a plurality of terminals, each terminal of the memory devices of the first plurality corresponding to an identical memory device function as a correspondingly positioned terminal of the memory devices of the second plurality, the first plurality of memory devices being mounted to the insulative substrate having at least a portion of the terminals of the memory devices in the first plurality each interconnected to one of the terminals of one of the memory devices in the second plurality and having a different memory device function therefrom; and
   a memory access device mounted on the substrate, the memory access device having a plurality of terminals that are coupled to respective ones of the interconnected terminals, the memory access device being operable to receive external memory requests and to couple address and control signals to the interconnected terminals responsive to the memory requests, at least one of the address signals or at least one of the control signals being dynamically coupled to the interconnected terminals in a first configuration if the first plurality of memory devices are being accessed, and the at least one of the address signals or at least one of the control signals being dynamically coupled to the interconnected terminals in a second configuration that is different from the first configuration if the memory devices of the second plurality are being accessed, the memory access device comprising:
      a command queue that is operable to receive the memory requests, the memory queue further being operable to convert the memory requests into respective sets of command and address signals and to output the command and address signals in the order that the respective memory requests were received;
      a command scheduler coupled to the command queue to receive the command and address signals from the command queue, the command scheduler arranging the timing of the command and address signals;
      a micro command shifter coupled to receive the command and address signals from the command scheduler after the timing of the command and address signals have been arranged, the micro command shifter being operable to output the command and address signals in synchronism with the operation of the memory devices; and
      a multiplexer coupled to the micro command shifter to receive the command signals or the address signals from the micro command shifter, the multiplexer being operable to arrange the command or address signals in either the first configuration or the second configuration depending on whether the memory devices of the first or second plurality are being accessed, the multiplexer being operable to couple the command or address signals in either the first configuration or the second configuration to the interconnected terminals.

2. The memory module of claim 1, wherein the first and second pluralities of memory devices are mounted on opposite sides of the insulative substrate.

3. The memory module of claim 1, wherein the memory access device is centrally positioned on the insulative substrate, and wherein the memory devices of the first and second pluralities are positioned to both sides of the memory access device, the memory access device being operable to couple respective sets of address or control signals in the first or second configuration to the memory devices of the first and second plurality on each side of the memory access device.

4. The memory module of claim 1, wherein a portion of the terminals of the memory devices of the first plurality are data terminals and are interconnected to data terminals of the memory devices of the second plurality, the memory access device structured to couple data signals to the interconnected data terminals irrespective of whether the first or second pluralities are being accessed.

5. The memory module of claim 1, wherein the multiplexer has first and second inputs, the first input being coupled to the micro command shifter and the second input being coupled to the command queue, the multiplexer being operable to receive command and address signals from the second input following a period of latency and to thereafter receive command and address signals from the first input.

6. The memory module of claim 1, further comprising a ring buffer coupled between the multiplexer and the memory devices.

7. The memory module of claim 1 wherein the memory access device comprises a register that is structured to receive and store address and control signals forming each of the memory requests, and couple the stored address and control signals to the memory devices.

8. The memory module of claim 1 wherein the memory devices each comprise a dynamic random access memory device.

9. A processor-based system, comprising:
   a processor having a processor bus;
   a system controller coupled to the processor bus, the system controller having a peripheral device port, the system controller further comprising a memory controller coupled to a system memory port;
   at least one input device coupled to the peripheral device port of the system controller;
   at least one output device coupled to the peripheral device port of the system controller;
   at least one data storage device coupled to the peripheral device port of the system controller; and a memory module coupled to the system memory port of the system controller, the memory module comprising:

an insulative substrate;

first and second pluralities of memory devices each having a plurality of terminals, each terminal of the memory devices of the first plurality corresponding to an identical memory device function as a correspondingly positioned terminal of the memory devices of the second plurality, the first plurality of memory devices being mounted to the insulative substrate having at least a portion of the terminals of the memory devices in the first plurality each interconnected to one of the terminals of one of the memory devices in the second plurality and having a different memory device function therefrom; and a memory hub mounted on and centrally positioned on the insulative substrate, the memory hub having a plurality of terminals that are coupled to respective ones of the interconnected terminals, the memory hub being coupled to the system controller and operable to receive higher level memory requests from the memory controller and to couple address and control signals to the interconnected terminals of the memory devices on each side of the memory hub responsive to the memory requests, at least one of the address signals or at least one of the control signals being dynamically coupled to the interconnected terminals in a first configuration if the first plurality of memory devices are being accessed, and the at least one of the address signals or at least one of the control signals being dynamically coupled to the interconnected terminals in a second configuration that is different from the first configuration if the memory devices of the second plurality are being accessed, the memory hub comprising:

a command queue that is operable to receive the memory requests, the memory queue further being operable to convert the memory requests into respective sets of command and address signals and to output the command and address signals in the order that the respective memory requests were received;

a command scheduler coupled to the command queue to receive the command and address signals from the command queue, the command scheduler arranging the timing of the command and address signals;

a micro command shifter coupled to receive the command and address signals from the command scheduler after the timing of the command and address signals have been arranged, the micro command shifter being operable to output the command and address signals in synchronism with the operation of the memory devices; and a multiplexer coupled to the micro command shifter to receive the command signals or the address signals from the micro command shifter, the multiplexer being operable to arrange the command or address signals in either the first configuration or the second configuration depending on whether the memory devices on the first surface or the memory devices on the second surface are being accessed, the multiplexer being operable to couple the command or address signals in either the first configuration or the second configuration to the interconnected terminals.

* * * * *